(12) United States Patent
Liu et al.

(10) Patent No.: US 11,855,415 B2
(45) Date of Patent: Dec. 26, 2023

(54) HIGH FREQUENCY SIGNAL COUPLING TO SURFACE EMITTERS

(71) Applicant: CREDO TECHNOLOGY GROUP LTD, Grand Cayman (KY)

(72) Inventors: Xike Liu, Shanghai (CN); Shuiqing Huang, Shanghai (CN); Rui Gao, Shanghai (CN)

(73) Assignee: Credo Technology Group Limited, Grand Cayman (KY)

( * ) Notice: Subject to any disclaimer, the term of this patent is extended or adjusted under 35 U.S.C. 154(b) by 73 days.

(21) Appl. No.: 17/655,701

(22) Filed: Mar. 21, 2022

(65) Prior Publication Data

US 2023/0086154 A1  Mar. 23, 2023

(30) Foreign Application Priority Data

Sep. 18, 2021 (CN) .......................... 202111101243.0

(51) Int. Cl.
| | |
|---|---|
| H01S 5/42 | (2006.01) |
| H01S 5/02345 | (2021.01) |
| H05K 1/18 | (2006.01) |
| H05K 1/11 | (2006.01) |
| H01R 13/6461 | (2011.01) |
| H05K 1/02 | (2006.01) |

(52) U.S. Cl.
CPC ......... *H01S 5/423* (2013.01); *H01R 13/6461* (2013.01); *H01S 5/02345* (2021.01); *H05K 1/0228* (2013.01); *H05K 1/111* (2013.01); *H05K 1/183* (2013.01); *H05K 2201/10189* (2013.01)

(58) Field of Classification Search
CPC .. H01R 13/6461; H05K 1/0228; H05K 1/111; H05K 1/183; H05K 2201/10189
USPC .......................................................... 361/760
See application file for complete search history.

(56) References Cited

U.S. PATENT DOCUMENTS

| | | | |
|---|---|---|---|
| 7,957,447 B2 | 6/2011 | Matsushita et al. | |
| 10,234,632 B1 * | 3/2019 | Keeler | ................ G02B 6/3834 |
| 2013/0092960 A1 * | 4/2013 | Wilcox | ............... H01L 25/0753 |
| | | | 257/88 |
| 2014/0239160 A1 | 8/2014 | Joo | |
| 2020/0194614 A1 * | 6/2020 | Pares | .................. H01L 31/1892 |
| 2020/0245465 A1 | 7/2020 | Zhang et al. | |

(Continued)

*Primary Examiner* — Andargie M Aychillhum
(74) *Attorney, Agent, or Firm* — Ramey LLP; Daniel J. Krueger

(57) ABSTRACT

To reduce crosstalk between bond wires, one illustrative integrated circuit includes an array of photoemitters arranged along a centerline, with adjacent photoemitters having contact pads on opposite sides of the centerline. An illustrative assembly includes an integrated circuit chip having an array of photoemitter contact pads; a printed circuit board having a recess in which the integrated circuit chip is mounted; and bond wires connecting the contact pads with respective contact pads on the printed circuit board. An illustrative cable connector includes a module that optically couples optical fibers to an array of photoemitters on an integrated circuit chip mounted to a printed circuit board. Each photoemitter has contact pads connected to the printed circuit board contact pads by bond wires, the bond wires for each photoemitter being routed in an opposite direction relative to the bond wires for any adjacent photoemitters in the array.

20 Claims, 3 Drawing Sheets

(56) References Cited

U.S. PATENT DOCUMENTS

2020/0381897 A1 12/2020 Cestier et al.
2021/0190915 A1* 6/2021 Snyder .................. G01S 7/4861

* cited by examiner

HIGH FREQUENCY SIGNAL COUPLING TO SURFACE EMITTERS

BACKGROUND

Demand continues for ever-increasing volumes and rates of data communication, demand that is gradually being addressed by sophisticated techniques for transmitting and receiving ever-higher frequency and higher-bandwidth signals via various forms of wireless and physical media. The signals are generated by transducers, which in many cases take the form of integrated circuit (IC) chips driven by electrical signals. In at least some instances, the transducers are surface emitters, meaning that the generated signals are emitted from the top surface of the IC chip. The top surface is usually also where the layers are patterned to provide the desired functionality including contact pads for receiving the electrical drive signals. Bond wires are the traditional (and thus the most reliable and usually least expensive) technique for connecting top surface contact pads to a substrate, such as a package substrate, interposer, or printed circuit board (PCB). However, bond wires are unshielded and thus subject to crosstalk at high signal frequencies, particularly where an IC chip contains multiple closely-spaced transducers.

SUMMARY

Accordingly, there are disclosed herein techniques for reducing crosstalk between bond wires coupling high frequency signals to multiple transducers in an integrated circuit (IC) chip. One illustrative integrated circuit chip includes an array of photoemitter devices arranged along an axis, the array having a centerline parallel to the axis, each photoemitter device having an anode contact pad on an opposite side of the centerline from the anode contact pads of any adjacent photoemitter devices in the array.

One illustrative printed circuit board assembly includes an integrated circuit chip having an array of photoemitter devices with associated contact pads; a printed circuit board having a recess in which the integrated circuit chip is mounted; and bond wires connecting the contact pads of the photoemitter devices with respective contact pads on a top surface of the printed circuit board.

One illustrative cable connector includes an optical coupling module that optically couples optical fibers to an array of photoemitters on an integrated circuit chip mounted to a printed circuit board. Each photoemitter in the array has contact pads connected to contact pads on the printed circuit board by bond wires, the bond wires for each photo emitter being routed in an opposite direction relative to the bond wires for any adjacent photoemitters in the array to reduce crosstalk.

Each of the foregoing may be implemented individually or in combination, and may be implemented with any one or more of the following features in any suitable combination: 1. each photoemitter device is a vertical cavity surface-emitting laser (VCSEL). 2. each photoemitter device has a cathode contact pad on the same side of the centerline as the anode contact pad. 3. each photoemitter device is rotated 180° relative to any adjacent photoemitter device in the array. 4. relative to any adjacent photoemitter device in the array, each photoemitter device is mirrored across the centerline. 5. each photoemitter device has an emitter surface on the centerline. 6. the recess has a depth substantially equal to a thickness of the integrated circuit chip. 7. the integrated circuit chip is mounted within 1 mm of at least one wall of the recess. 8. the array of photoemitter devices is arranged along an centerline and each photoemitter device in the array has an anode contact pad on an opposite side of the centerline from the anode contact pads of any adjacent photoemitter devices in the array. 9. the bond wires connect contact pads on each side of the centerline with printed circuit board contact pads on the same side of the centerline such that bond wires for adjacent photoemitters are routed in opposite directions from the centerline. 10. the array of photoemitter devices are arranged along a centerline with each photoemitter device having its contact pads on an opposite side of the centerline from the contact pads of any adjacent photoemitter devices in the array.

DETAILED DESCRIPTION

Figure 1:
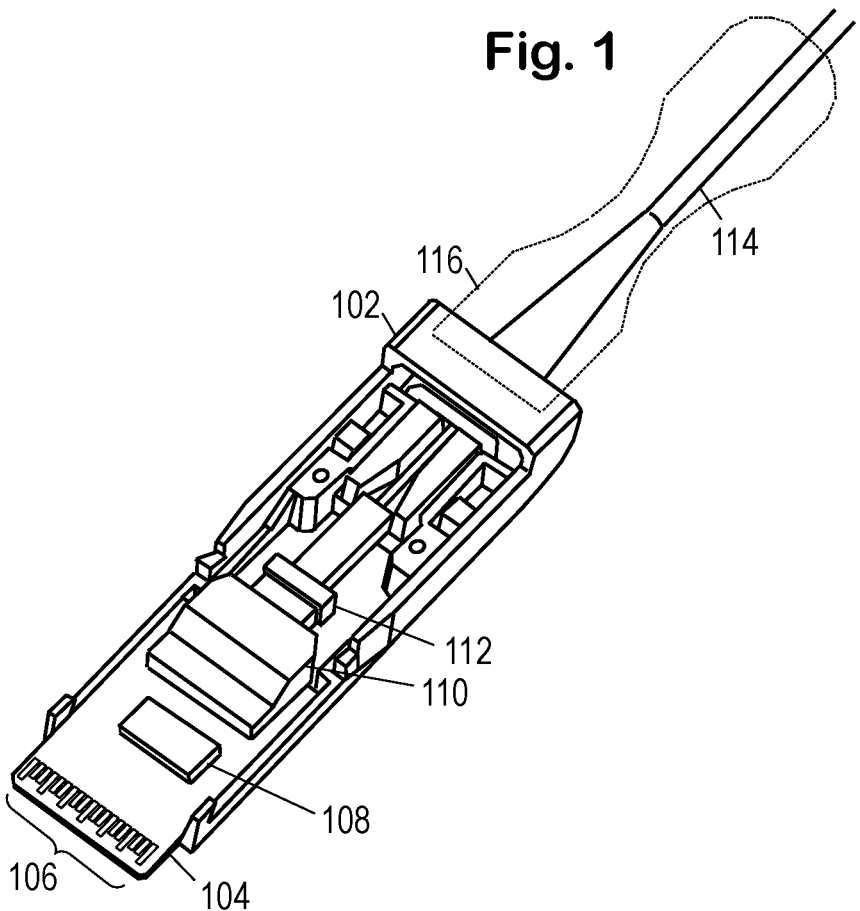
FIG. 1 is a perspective view of an illustrative fiberoptic cable connector.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

For context, FIG. 1 shows an illustrative connector of a fiberoptic cable such as might be used to connect network devices in a data processing center. A connector frame 102 houses a printed circuit board (PCB) assembly 104 configured with edge connector contacts 106 that mate with contacts in a socket of a host device's network interface port to send and receive electrical signals. The PCB assembly 104 includes one or more packaged integrated circuit (IC) chips or discrete electrical components mounted to contact pads on the PCB. For example, the PCB assembly 104 may include a data recovery and remodulation (DRR) device 108 to equalize received signals, recover the data, and retransmit the recovered data, optionally providing error correction, signal format conversion, and lane realignment The PCB assembly 104 includes an optical coupling module 110 that couples integrated photodetectors and photoemitters to one or more optical paths. When mated with the optical coupling module 110, a ferrule 112 aligns one or more optical fibers the fiberoptic cable 114 with the one or more optical paths. The optical coupling module 110 may typically use lenses and prisms to define the optical paths that couple light signals between the optical fibers and the photodetectors and photoemitters, though other optical elements (e.g., mirrors, gratings) would also be suitable.

The fiberoptic cable connector may further include a cover and a finger grip 116 to protect the other components from damage during normal use.

Figure 2:
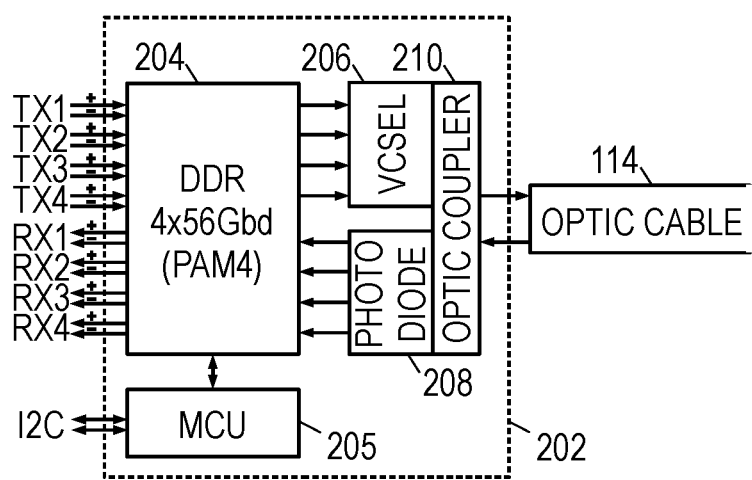
FIG. 2 is a block diagram of an illustrative fiberoptic cable connector.

FIG. 2 is a block diagram to more clearly illustrate the signal flows of an illustrative fiberoptic cable connector 202. A DRR device 204 couples to the network interface port to accept 56 gigabaud (GBd) electrical transmit signals on each of four lanes and to provide 56 GBd electrical receive signals on each of four lanes. The electrical transmit and receive signals are differential signals that may employ non-return to zero (NRZ) signaling or 4-level pulse amplitude modulation (PAM4) signaling. After accounting for overhead, four signal lanes collectively transport data at a nominal 200 gigabits per second (Gbps) for NRZ and 400 Gbps for PAM4.

The connector 202 may further include a microcontroller unit (MCU) 205 that couples to the network interface port via a management data bus such as the inter-integrated circuit (I2C) bus or the management data input/output (MDIO) bus. The host may use the management data bus to identify the cable's capabilities, determine connection status, diagnose faults, and/or configure operation of the cable connector. The MCU 205 processes commands received via the management data bus to appropriately read or set the control registers of the DRR device 204. In at least some cases, the MCU 205 is integrated into the DRR device 204.

Optical coupling module 110 (FIG. 1) includes photoemitter array 206, optical path coupler 210, and photodetector array 208. DRR device 204 converts the electrical transmit signals into remodulated electrical transmit signals that drive an array of photoemitters 206. As one example discussed further below, the photoemitters in the array are vertical cavity surface-emitting lasers (VCSEL). VCSEL array implementation details are available in the literature including, for example, U.S. Pat. No. 7,957,447 ("VCSEL Array Device and Method for Manufacturing the VCSEL Array Device") and US Pat. App. Pub. 2020/0381897 ("Vertical-cavity Surface-emitting Laser with Characteristic Wavelength of 910 nm"). The electrical drive signals cause current flow in the photoemitters, which in turn emit light signals having an intensity corresponding to the amplitude of the current flow.

An optical path coupler 210 optically couples the light signals from the photoemitters to optical fibers in cable 114 and couples light signals from optical fibers cable 114 to an array of photodetectors 208. Various suitable photodetector implementations are available in the literature. As one example, the photodetectors in the array are photodiodes having an impedance that corresponds to the intensity of a received light signal. The photodiodes can be voltage-biased to convert the impedance into a corresponding current flow. A transimpedance amplifier (TIA) provides amplification of the current flow while transforming the current flow into a receive signal voltage.

Figure 3:
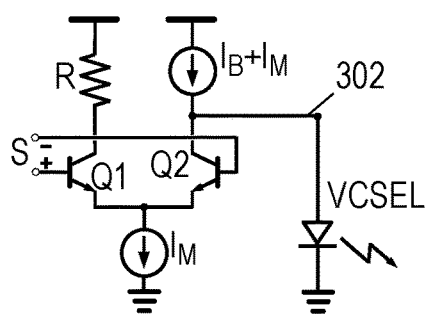
FIG. 3 is a schematic of an illustrative driver for a surface emitter.

FIG. 3 is a schematic of an illustrative driver for a photoemitter in array 206. A remodulated transmit signal S is supplied as a differential signal to the bases of a differential transistor pair Q1, Q2. When the signal S is at its maximum positive amplitude, current sink $I_M$ draws current through transistor Q1 rather than Q2, such that all of the current from current source $I_B+I_M$ flows through photoemitter VCSEL. When signal S is at its most negative, current sink $I_M$ draws current through transistor Q2 rather than Q1, such that only the bias current $I_B$ from current source $I_B+I_M$ flows through photoemitter VCSEL.

Although some configurations implement the drivers for the photoemitter array and amplifiers for the photodetector array as support components separate from the DRR device, it may be preferred to include the drivers and amplifiers as integrated elements of the DRR device. In any event, it is expected that the gain and output offset of the drivers and amplifiers can be varied adaptively and/or controlled by the MCU 205.

Figure 4:
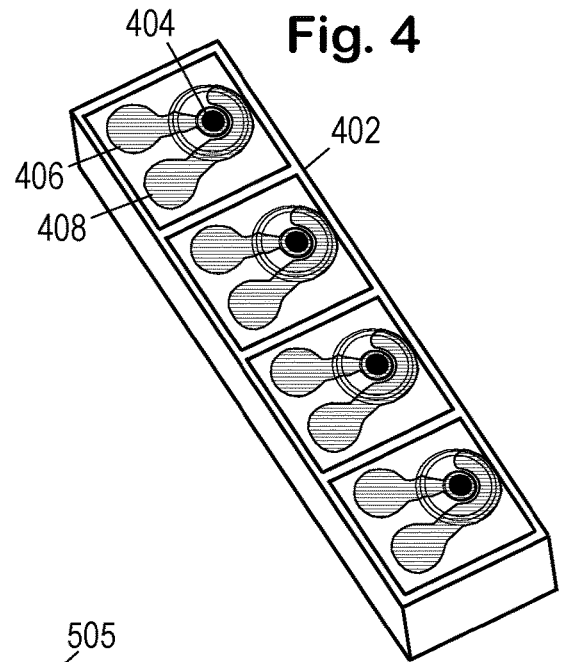
FIG. 4 is an isometric view of a first illustrative vertical cavity surface-emitting laser (VCSEL) chip.

FIG. 4 is an isometric view of a first illustrative integrated circuit chip 402 having an array of VCSEL photoemitters. Each photoemitter in the array has a emitter surface or "window" 404 to the active region, a contact pad 406 for the anode, and a contact pad 408 for the cathode. Current passing through the active region from the anode to the cathode produces coherent light emission from the emitter surface 404. The optical coupling module 110 (FIG. 1) defines optical paths from the emitter surfaces 404 to associated fibers of the fiberoptic cable.

Figure 5:
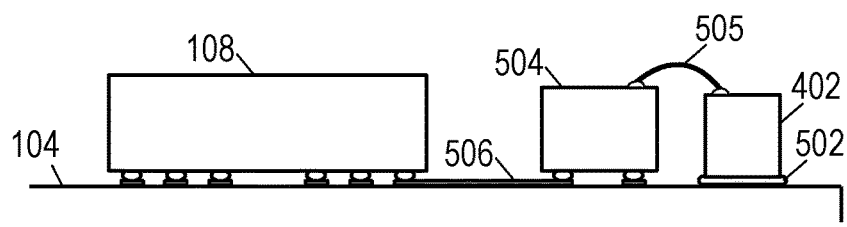
FIG. 5 is a side view of a first illustrative VCSEL coupling arrangement.

FIG. 5 is a side view of a portion of the PCB assembly 104 to illustrate a first photoemitter coupling arrangement in which a photoemitter array chip 402 is mounted to the PCB with adhesive 502. A discrete driver chip 504 includes an array of drivers that supply current to the photoemitters via bond wires 505. The bond wires are soldered to contact pads on the chips 402, 504 (and in other arrangements, soldered to contact pads on the PCB). The drive current corresponds to remodulated transmit signals received from the DRR chip 108 via PCB traces 506. The DRR device 108 may be mounted in a flip-chip configuration where a ball-grid array provides the electric connections between contact pads on the device and PCB. The driver chip 504 may have contact pads for ball-grid connections and contact pads for bond wire connections. Vias can be used to provide electrical conduction paths between the top and bottom surfaces of driver chip 504.

Given the greater than 50 GHz signal frequency range of the drive currents, it is desirable to keep the bond wire lengths relatively short to minimize electromagnetic coupling and signal crosstalk between the bond wires. If the driver chip 504 is placed close to the photoemitter array chip 402, the lengths of the bond wires 505 can be minimized, particularly if the thicknesses of the chips 402, 504 are approximately equal. If bare dies (chips that have not been packaged) are used, an illustrative device thickness would be 150 micrometers. The thickness varies based on the manufacturing process and thicknesses in the range from 100 to 500 micrometers would not be unusual. The height of the photoemitter contact pads also depends on the thickness of the adhesive 502 or geometry of any alternative attachment mechanism employed.

Figure 6:
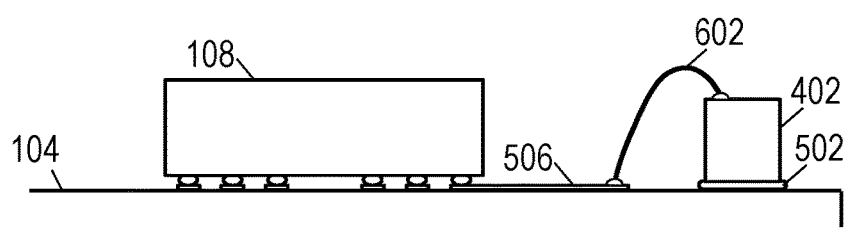
FIG. 6 is a side view of a second illustrative VCSEL coupling arrangement.

FIG. 6 is a side view of the PCB assembly 104 with a second coupling arrangement that integrates the driver circuitry into the DRR device 108. Lacking the driver chip 504, the second coupling arrangement requires longer bond wires 602 to couple the photoemitter contact pads to the contact pads on the top surface of the PCB to receive the drive current from the PCB traces 506. The benefit of the reduced component count is offset by the increased bond wire lengths and resulting increase in signal crosstalk. The impedance mismatch between the longer bond wires and the PCB traces also increases the magnitude of signal reflections, reducing the signal-to-interference ratio of the transmit signals.

Figure 7:
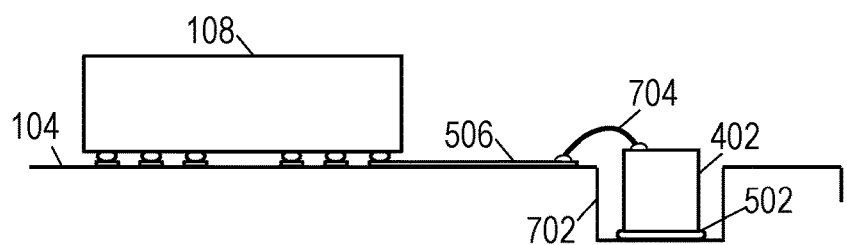
FIG. 7 is a side view of a third illustrative VCSEL coupling arrangement.

FIG. 7 is a side view of the PCB assembly 104 with a third coupling arrangement. In this coupling arrangement, the driver circuitry is again integrated into the DRR device 108. The photoemitter array chip 402 is mounted within a recess 702 to reduce the length of the bond wires 704 connecting photoemitter contact pads to the contact pads for the PCB traces 506. The recess may be a cavity, groove, ledge, or other reduced-thickness portion of the PCB substrate. The distance between the chip 402 and the walls of the recess is preferably also minimized (made less than, e.g., 1 mm) to enable the PCB contact pads to be located nearer the corresponding photoemitter contact pads. Preferably the depth of recess 702 approximately equals the thickness of the photoemitter chip 402 and/or is sufficient to substantially align the photoemitter contact pad height with the height of the contact pads for the PCB traces 506 on the top surface of the PCB. Nevertheless, reduced crosstalk is also achievable with a shallower recess. The reduced bond wire length reduces impedance discontinuities encountered by the drive signals, also reducing degradation of signal to interference ratio caused by reflections.

Figure 8:
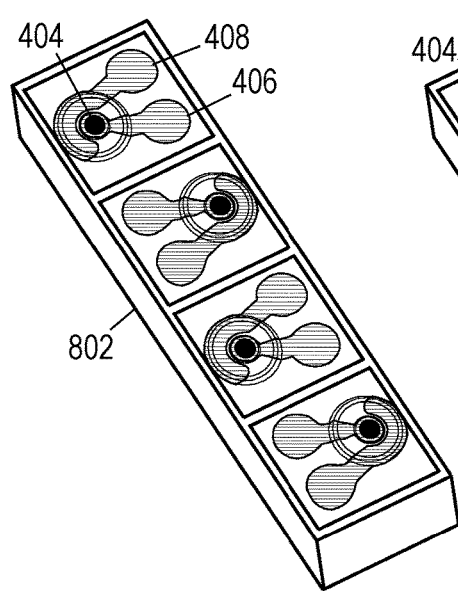
FIG. 8 is an isometric view of a second illustrative VCSEL chip.

Crosstalk can alternatively or additionally be reduced by rearranging the contact pads of the photoemitter array to enable increased separation between the bond wires for adjacent photoemitters. For example, FIG. 8 shows a second illustrative integrated circuit chip 802 having an array of VCSEL photoemitters. As compared with chip 402 (FIG. 4), every second photoemitter in the array has been rotated 180°, placing the contact pads for a given photoemitter on the opposite side of the chip from the contact pads of the adjacent photoemitters in the array. As will be discussed with reference to FIGS. 11 and 12, this contact pad arrangement enables adjacent photoemitters to have their bond wires routed from opposite directions. The separation between bond wires for adjacent photoemitters can thereby be increased without increasing the chip dimensions or device area.

Figure 9:
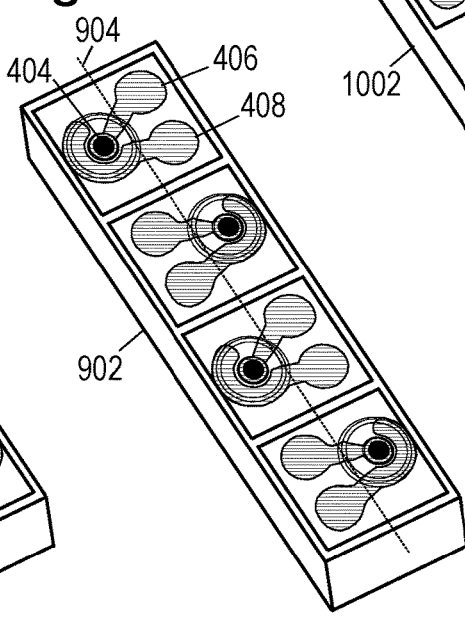
FIG. 9 is an isometric view of a third illustrative VCSEL chip.

FIG. 9 shows a third illustrative integrated circuit chip 902 having an array of VCSEL photoemitters. As compared with chip 402 (FIG. 4), every second photoemitter in the array has been mirrored (or "flipped") relative to the array's long centerline 904 (the centerline parallel to the array's long axis). The contact pads for adjacent photoemitters again appear on opposite sides of the chip, enabling bond wires for adjacent photoemitters to be routed from opposite directions. Unlike the arrangement of FIG. 8, the anode-to-anode and cathode-to-cathode wire spacing of this arrangement is uniform.

Figure 10:
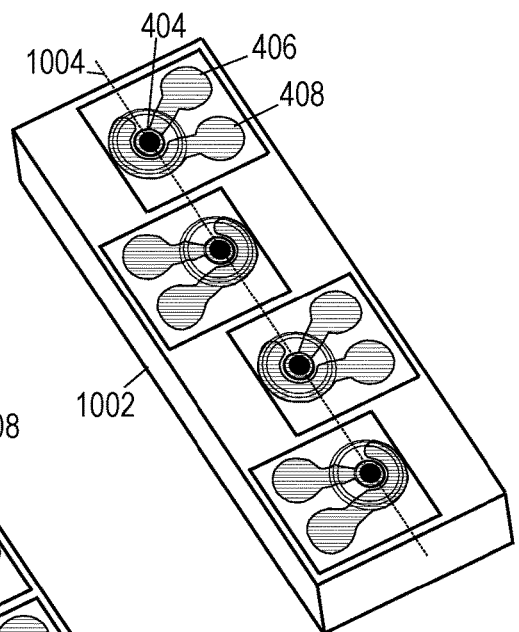
FIG. 10 is an isometric view of a fourth illustrative VCSEL chip.

Unlike the array of chip 402 (FIG. 4), the emitter surfaces 404 of FIGS. 8 and 9 are not colinear. It is expected that the optical coupling module 110 (FIG. 1) can be readily configured to account for the optical path differences needed to couple the emitter surfaces to the optical fibers. Where it is desired to maintain colinearity of the emitter surfaces (e.g., for use with existing optical coupling modules), the flipped or rotated photoemitters can be offset as shown by the fourth illustrative integrated circuit chip 1002 in FIG. 10. In contrast with chip 902, every second photoemitter in the array has been mirrored relative to an axis 1004 through the emitter surfaces rather than through a centerline of the array. The width of chip 1002 has been increased, further increasing separation of the bond wires for adjacent devices.

Figure 11:
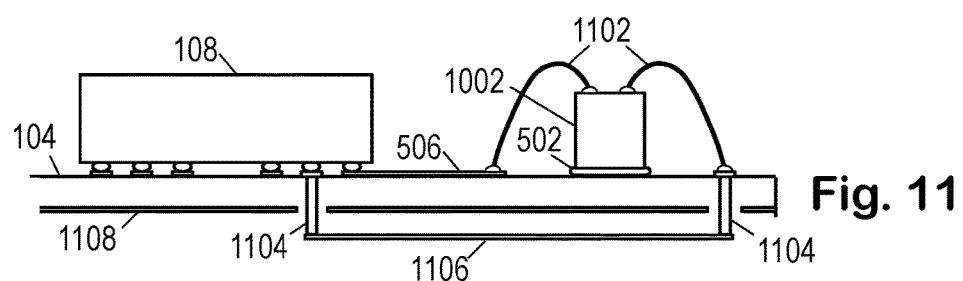
FIG. 11 is a side view of a fourth illustrative VCSEL coupling arrangement.

FIG. 11 is a side view of the PCB assembly 104 with a fourth coupling arrangement. As before, the driver circuitry is integrated into DRR device 108, which supplies the drive signals to the photoemitter array chip 1002 via PCB traces 506, 1106 and bond wires 1102. To reach the PCB contact pads for the far side of chip 1002, some of the PCB traces 1106 may be at least partially located in different routing layers of the PCB, connected PCB contact pads by vias 1104. In some cases, a ground plane 1108 may be provided to prevent crosstalk between the traces in different routing layers.

Figure 12:
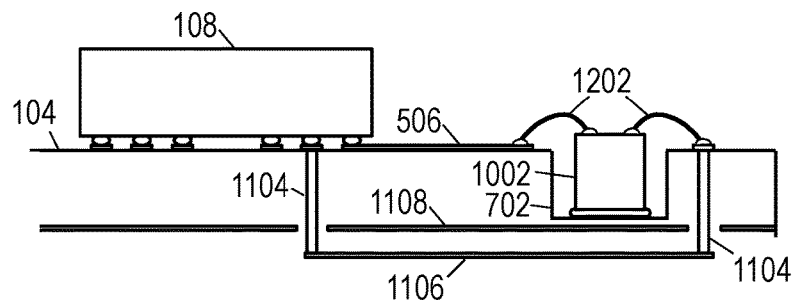
FIG. 12 is a side view of a fifth illustrative VCSEL coupling arrangement.

FIG. 12 is a side view of the PCB assembly 104 with a fifth coupling arrangement. The DRR device's integrated driver circuitry is coupled to the photoemitter array chip 1002 via PCB traces 506, 1106, and bond wires 1202. The bond wires 1202 for adjacent photoemitters in the array are routed from opposite directions to increase separation between the bond wires. The photoemitter array chip 1002 is mounted in a recess 702 to reduce the length of the bond wires, further reducing crosstalk between bond wires.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. A monolithic integrated circuit chip that comprises: an array of photoemitter devices arranged in a line on a surface of the monolithic integrated circuit chip, the array having a centerline parallel to a long axis of the array, each photoemitter device having one or more adjacent photoemitter devices in the array and having an anode contact pad on an opposite side of the centerline from the anode contact pads of all adjacent photoemitter devices in the array.

2. The integrated circuit chip of claim 1, wherein each photoemitter device is a vertical cavity surface-emitting laser (VCSEL) having a cathode contact pad on the same side of the centerline as the anode contact pad.

3. The integrated circuit chip of claim 2, wherein each photoemitter device is rotated 180° relative to all adjacent photoemitter devices in the array.

4. The integrated circuit chip of claim 2, wherein relative to all adjacent photoemitter devices in the array, each photoemitter device is mirrored across the centerline.

5. The integrated circuit chip of claim 2, wherein each photoemitter device has an emitter surface on the centerline.

6. A printed circuit board assembly that comprises: an integrated circuit chip having an array of photoemitter devices with associated contact pads; a printed circuit board having a recess in which the integrated circuit chip is mounted; and bond wires connecting the contact pads of the photoemitter devices with respective contact pads on a top surface of the printed circuit board.

7. The printed circuit board assembly of claim 6, wherein the recess has a depth substantially equal to a thickness of the integrated circuit chip.

8. The printed circuit board assembly of claim 6, wherein the integrated circuit chip is mounted within 0.1 mm of at least one wall of the recess.

9. The printed circuit board assembly of claim 6, wherein the array of photoemitter devices is arranged in a line on a surface of the integrated circuit chip, wherein the array has a centerline parallel to a long axis of the array and each photoemitter device in the array has an anode contact pad on an opposite side of the centerline from the anode contact pads of all adjacent photoemitter devices in the array.

10. The printed circuit board assembly of claim 9, wherein the bond wires connect contact pads on each side of the centerline with printed circuit board contact pads on the same side of the centerline such that bond wires for adjacent photoemitters are routed in opposite directions from the centerline.

11. The printed circuit board assembly of claim 9, wherein each photoemitter device is a vertical cavity surface-emitting laser (VCSEL).

12. The printed circuit board assembly of claim 10, wherein each photoemitter device has a cathode contact pad on the same side of the centerline as the anode contact pad.

13. The printed circuit board assembly of claim 12, wherein each photoemitter device is rotated 180° relative to any adjacent photoemitter device in the array.

14. The printed circuit board assembly of claim 12, wherein relative to any adjacent photoemitter device in the array, each photoemitter device is mirrored across the centerline.

15. The printed circuit board assembly of claim 12, wherein each photoemitter device has an emitter surface on the centerline.

16. A cable connector that comprises:
 an optical coupling module that optically couples optical fibers to an array of photoemitters on an integrated circuit chip mounted to a printed circuit board, each photoemitter in the array having contact pads connected to contact pads on the printed circuit board by bond wires, the bond wires for each photo emitter being routed in an opposite direction relative to the bond wires for any adjacent photoemitters in the array to reduce crosstalk.

17. The cable connector of claim 16, wherein the array of photoemitter devices are arranged along an axis, the array having a centerline parallel to the axis, each photoemitter device having its contact pads on an opposite side of the centerline from the contact pads of any adjacent photoemitter devices in the array.

18. The cable connector of claim 17, wherein each photoemitter device in the array has an emitter surface on the centerline.

19. The cable connector of claim 17, wherein the integrated circuit chip is mounted in a recess on the printed circuit board, the recess having a depth substantially equal to a thickness of the integrated circuit chip.

20. The cable connector of claim 19, wherein the recess has walls within 0.1 mm of the integrated circuit chip.

* * * * *